(12) United States Patent
Nagimov et al.

(10) Patent No.: US 11,934,237 B2
(45) Date of Patent: Mar. 19, 2024

(54) HYBRID MOTHERBOARD COOLING SYSTEM FOR AIR-COOLED SERVERS

(71) Applicant: Microsoft Technology Licensing, LLC, Redmond, WA (US)

(72) Inventors: Ruslan Nagimov, Redmond, WA (US); Eric Clarence Peterson, Woodinville, WA (US); Winston Allen Saunders, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 157 days.

(21) Appl. No.: 17/361,277

(22) Filed: Jun. 28, 2021

(65) Prior Publication Data
US 2022/0413570 A1    Dec. 29, 2022

(51) Int. Cl.
*H05K 7/20* (2006.01)
*G06F 1/20* (2006.01)

(52) U.S. Cl.
CPC .............. *G06F 1/20* (2013.01); *H05K 7/202* (2013.01); *H05K 7/203* (2013.01);
(Continued)

(58) Field of Classification Search
CPC .... H05K 7/202; H05K 7/203; H05K 7/20318; H05K 7/327; H05K 7/20254; H05K 7/20772; H05K 7/20236; H05K 7/20272; H05K 1/0203; H05K 5/06; H05K 7/20281; G06F 2200/201; G06F 1/20; H01L 23/473; F28F 3/06; F28F 3/12; F28F 9/001
(Continued)

(56) References Cited

U.S. PATENT DOCUMENTS 5,305,184 A * 4/1994 Andresen ........... H05K 7/20872
361/720
7,369,410 B2   5/2008 Chen et al.
(Continued)

FOREIGN PATENT DOCUMENTS

EP    3629691 A1    4/2020

OTHER PUBLICATIONS

"International Search Report and Written Opinion Issued in PCT Application No. PCT/US22/029940", dated Nov. 18, 2022, 23 Pages.
(Continued)

*Primary Examiner* — Mandeep S Buttar
(74) *Attorney, Agent, or Firm* — RAY QUINNEY & NEBEKER P.C.; Paul N. Taylor

(57) ABSTRACT

A motherboard assembly comprises a motherboard, a first computing component attached to the motherboard, and a coolant container attached to the motherboard. An air-cooled heat sink is attached to the coolant container. The coolant container, the heat sink, and the motherboard form a hermetically sealed enclosure that encompasses the first computing component and that is configured to retain dielectric working fluid covering the first computing component. The heat sink is positioned to condense vapors formed from boiling of the dielectric working fluid and to cause condensed dielectric working fluid to return to a pool of the dielectric working fluid that comprises the first computing component. The motherboard assembly additionally comprises a second computing component attached to the motherboard and positioned outside of the hermetically sealed enclosure.

21 Claims, 10 Drawing Sheets

(52) U.S. Cl.
CPC ..... *H05K 7/20318* (2013.01); *H05K 7/20327* (2013.01); *G06F 2200/201* (2013.01)

(58) Field of Classification Search
USPC ..... 361/699, 700, 703, 704, 679.47, 679.53, 361/679.54, 689, 701; 165/104.33, 80.2, 165/80.3, 80.4, 104.21, 908
See application file for complete search history.

(56) References Cited

U.S. PATENT DOCUMENTS

| | | | |
|---|---|---|---|
| 8,941,994 | B2 | 1/2015 | Campbell et al. |
| 10,542,640 | B1* | 1/2020 | Leigh ................. H05K 7/20772 |
| 10,548,239 | B1 | 1/2020 | Iyengar et al. |
| 10,548,240 | B1* | 1/2020 | Iyengar .............. H05K 7/20254 |
| 10,842,043 | B1* | 11/2020 | Zhang ................. H05K 7/20254 |
| 10,966,352 | B2 | 3/2021 | Iyengar et al. |
| 2010/0328889 | A1* | 12/2010 | Campbell .......... H05K 7/20809 361/699 |
| 2013/0105122 | A1 | 5/2013 | Campbell et al. |
| 2014/0218858 | A1* | 8/2014 | Shelnutt ................. H05K 7/203 361/679.31 |
| 2014/0249690 | A1* | 9/2014 | Park ...................... G06F 1/3206 702/132 |
| 2015/0109735 | A1* | 4/2015 | Campbell ............ H05K 7/2079 361/700 |
| 2019/0348345 | A1 | 11/2019 | Parida et al. |
| 2019/0357378 | A1* | 11/2019 | Kolar ................. H05K 7/20327 |
| 2020/0404805 | A1 | 12/2020 | Gao |
| 2021/0010757 | A1 | 1/2021 | Hachiya et al. |
| 2021/0291618 | A1* | 9/2021 | Xue ................... B60H 1/00521 |

OTHER PUBLICATIONS

"2-Phase cooling is the future Incooling", Retrieved from: https://www.incooling.com/news/2-phase-cooling-is-the-future/, Retrieved Date: May 21, 2021, 3 Pages.

"Two-Phase Liquid Immersion Cooling", In White Paper of Gigabyte, May 16, 2021, 8 Pages.

"wiwynnteam, "Wiwynn 2-Phase Immersion Cooling Solution Introduction," Wiwynn.", Retrieved from: https://www.wiwynn.com/products/wiwynn-2-phase-immersion-cooling-solution-introduction/, Jul. 19, 2018, 2 Pages.

"ZutaCore—HyperCool", Retrieved from: https://www.youtube.com/watch?v=5EuAv1nvN2g, Nov. 26, 2018, 4 Pages.

Miller, Rich, "Facebook Tests Immersion Cooling", Retrieved from: https://www.datacenterknowledge.com/archives/2012/12/21/facebook-tests-immersion-cooling, Dec. 21, 2012, 5 Pages.

Roach, John, "To cool datacenter servers, Microsoft turns to boiling liquid", Retrieved from: https://news.microsoft.com/innovation-stories/datacenter-liquid-cooling/, Apr. 6, 2021, 11 Pages.

"Invitation to Pay Additional Fees Issued in PCT Application No. PCT/US22/029940", dated Sep. 21, 2022, 15 Pages.

* cited by examiner

HYBRID MOTHERBOARD COOLING SYSTEM FOR AIR-COOLED SERVERS

CROSS-REFERENCE TO RELATED APPLICATIONS

N/A

BACKGROUND

Computing devices include heat-generating components that can produce significant amounts of heat during normal operation. Examples of such heat-generating components include central processing units (CPUs), graphics processing units (GPUs), tensor processing units (TPUs), memory devices, and other integrated circuits.

Computer cooling is the process of removing heat generated by heat-generating components within a computing device to keep components within permissible operating temperature limits. Cooling can be important because computer components are susceptible to temporary malfunction or permanent failure if they are overheated.

A datacenter is a physical facility that is used to house computing devices and associated components. A datacenter typically includes a large number of computing devices (e.g., servers), which may be stacked in racks that are placed in rows. A colocation center is a type of datacenter where equipment, space, and network bandwidth are available for rental to customers.

Increased power consumption of computing components has led to the introduction of new cooling techniques, such as immersion cooling. Conventional immersion cooling techniques involve submerging computing devices in a thermally conductive, electrically isolating dielectric fluid, which may be referred to as a dielectric working fluid or a heat transfer fluid.

Broadly speaking, there are two different types of immersion cooling techniques: single-phase immersion cooling and two-phase immersion cooling.

With a single-phase immersion cooling system, the dielectric working fluid never changes state and always remains in a liquid form. In some implementations, the dielectric working fluid may be actively circulated by pumping the dielectric coolant in, through, and around the computing devices being cooled, and then transferring the heat absorbed by the coolant to a heat rejection device such as a radiator, dry cooler, liquid-to-liquid heat exchanger, or cooling tower. Alternatively, the dielectric working fluid may be passively circulated by the natural convection of the heated coolant to the heat rejection device(s).

In a two-phase immersion cooling system, the heat of vaporization and the specific heat capacity characteristics of the dielectric working fluid are utilized for cooling. The dielectric working fluid generally has a relatively low boiling point such that heat absorbed by the dielectric working fluid surrounding the computing devices causes a portion of the dielectric working fluid to boil off or vaporize into a gas. The phase change of the dielectric working fluid carries heat away from the computing devices. The vapors produced by the boiling of the dielectric working fluid rise above the fluid pool where they contact a condenser that is cooler than the dielectric working fluid's boiling point. This causes the vapors to condense back into a liquid and fall back into the fluid pool.

The subject matter in the background section is intended to provide an overview of the overall context for the subject matter disclosed herein. The subject matter discussed in the background section should not be assumed to be prior art merely as a result of its mention in the background section. Similarly, a problem mentioned in the background section or associated with the subject matter of the background section should not be assumed to have been previously recognized in the prior art.

SUMMARY

In accordance with one aspect of the present disclosure, a coolant container subassembly for a hybrid cooling system is disclosed. The coolant container subassembly comprises a coolant container comprising an upper portion and a lower portion. The coolant container subassembly further comprises a lower surface on the lower portion of the coolant container. The lower surface is configured for attachment to a motherboard to form a hermetically sealed enclosure that encompasses a first computing component on the motherboard without encompassing a second computing component on the motherboard. The hermetically sealed enclosure is configured to retain dielectric working fluid in fluid communication with the first computing component. The coolant container subassembly further comprises an air-cooled heat sink and an upper surface on the upper portion of the coolant container. The upper surface is configured for attachment to the air-cooled heat sink such that the air-cooled heat sink is positioned to condense vapors formed from boiling of the dielectric working fluid and to cause condensed dielectric working fluid to return to a pool of the dielectric working fluid that comprises the first computing component.

In some embodiments, the first computing component can generate a greater amount of heat flux than the second computing component.

In some embodiments, the first computing component can comprise a central processing unit (CPU), and the second computing component can comprise a memory device.

In some embodiments, the motherboard can comprise a two-phase cooling zone and an air-cooled zone that is separate from the two-phase cooling zone. The first computing component and the coolant container can be attached to the two-phase cooling zone of the motherboard. The second computing component can be attached to the air-cooled zone of the motherboard.

In some embodiments, the coolant container subassembly can additionally comprise a first groove in the upper portion of the coolant container, a first gasket that fits within the first groove and that seals the upper portion of the coolant container to the heat sink, a second groove in the lower portion of the coolant container, and a second gasket that fits within the second groove and that seals the lower portion of the coolant container to the motherboard.

In some embodiments, the coolant container subassembly can additionally comprise a shut-off valve comprising an open position and a closed position. The shut-off valve can be coupled to the coolant container such that the dielectric working fluid can flow into or out of an interior portion of the coolant container when the shut-off valve is in the open position, and the dielectric working fluid is prevented from flowing into or out of the interior portion of the coolant container when the shut-off valve is in the closed position.

In some embodiments, the coolant container subassembly can additionally comprise a pressure relief valve coupled to the coolant container.

In some embodiments, the coolant container subassembly can additionally comprise a temperature sensor that is positioned to detect a change in temperature that results from a release of the dielectric working fluid from the pressure relief valve.

In some embodiments, the coolant container subassembly can additionally comprise a pressure sensor that is coupled to the coolant container and positioned to detect pressure in the hermetically sealed enclosure. The pressure sensor can be configured to be communicatively coupled to an auxiliary service processor on the motherboard.

In some embodiments, the first computing component can be a central processing unit (CPU). The auxiliary service processor can be configured to cause a clock frequency of the CPU to be reduced in response to receiving an indication from the pressure sensor that the pressure in the hermetically sealed enclosure exceeds a threshold value.

In some embodiments, the coolant container subassembly can additionally comprise a plate that is configured for attachment to the lower portion of the coolant container through a bottom surface of the motherboard.

In some embodiments, the motherboard can comprise a plurality of mounting holes, and the coolant container subassembly can additionally comprise a plurality of fasteners that attach the coolant container to the motherboard via the plurality of mounting holes.

In accordance with another aspect of the present disclosure, a motherboard assembly comprising a hybrid cooling system is disclosed. The motherboard assembly includes a motherboard comprising a two-phase cooling zone and an air-cooled zone. The motherboard assembly comprises a coolant container comprising an upper portion and a lower portion. The motherboard assembly additionally comprises a lower surface on the lower portion of the coolant container. The lower surface is configured for attachment to a two-phase cooling zone of a motherboard to form a hermetically sealed enclosure that encompasses a first computing component in the two-phase cooling zone. The hermetically sealed enclosure is configured to retain enough dielectric working fluid to submerge the first computing component in the dielectric working fluid. The motherboard assembly additionally comprises an air-cooled heat sink and an upper surface on the upper portion of the coolant container. The upper surface is configured for attachment to the air-cooled heat sink such that the air-cooled heat sink is positioned to condense vapors formed from boiling of the dielectric working fluid and to cause condensed dielectric working fluid to return to a pool of the dielectric working fluid that comprises the first computing component. The motherboard assembly additionally comprises a shut-off valve coupled to the coolant container. The shut-off valve is in fluid communication with an interior portion of the coolant container.

In some embodiments, the motherboard can additionally comprise a passively cooled zone. The two-phase cooling zone can be positioned between the passively cooled zone and the air-cooled zone.

In some embodiments, at least one additional computing component can be attached to the two-phase cooling zone of the motherboard and positioned within the hermetically sealed enclosure when the lower surface on the lower portion of the coolant container is attached to the two-phase cooling zone of the motherboard.

In some embodiments, the shut-off valve can comprise an open position and a closed position. The shut-off valve can be coupled to the coolant container such that the dielectric working fluid can flow into or out of an interior portion of the coolant container when the shut-off valve is in the open position. The dielectric working fluid can be prevented from flowing into or out of the interior portion of the coolant container when the shut-off valve is in the closed position.

In some embodiments, the motherboard assembly can additionally comprise a pressure relief valve coupled to the coolant container and a temperature sensor that is positioned to detect a change in temperature that results from a release of the dielectric working fluid from the pressure relief valve.

In some embodiments, the motherboard assembly can additionally comprise a pressure sensor that is coupled to the coolant container and positioned to detect pressure in the hermetically sealed enclosure. The pressure sensor can be configured to be communicatively coupled to an auxiliary service processor on the motherboard.

In accordance with another aspect of the present disclosure, a method for cooling computing components in a server using a hybrid cooling system is disclosed. The method includes partitioning a motherboard into a plurality of thermal zones including a two-phase cooling zone and an air-cooled zone. The method also includes attaching a first computing component to the two-phase cooling zone. The method also includes attaching a second computing component to the air-cooled zone. The method also includes attaching a lower portion of a coolant container to the two-phase cooling zone of the motherboard. The method also includes attaching a heat sink to an upper portion of the coolant container to form an enclosure that comprises the first computing component. The method also includes hermetically sealing the enclosure. The method also includes adding dielectric working fluid to the enclosure to form a pool of the dielectric working fluid, wherein the first computing component is submerged in the pool of the dielectric working fluid. The method also includes operating the server including the first computing component and the second computing component.

In some embodiments, the operation of the first computing component can cause the dielectric working fluid to boil. The method can additionally comprise positioning the heat sink to condense vapors formed from boiling of the dielectric working fluid and to cause condensed dielectric working fluid to return to the pool of the dielectric working fluid.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which.

DETAILED DESCRIPTION

Figure 1:
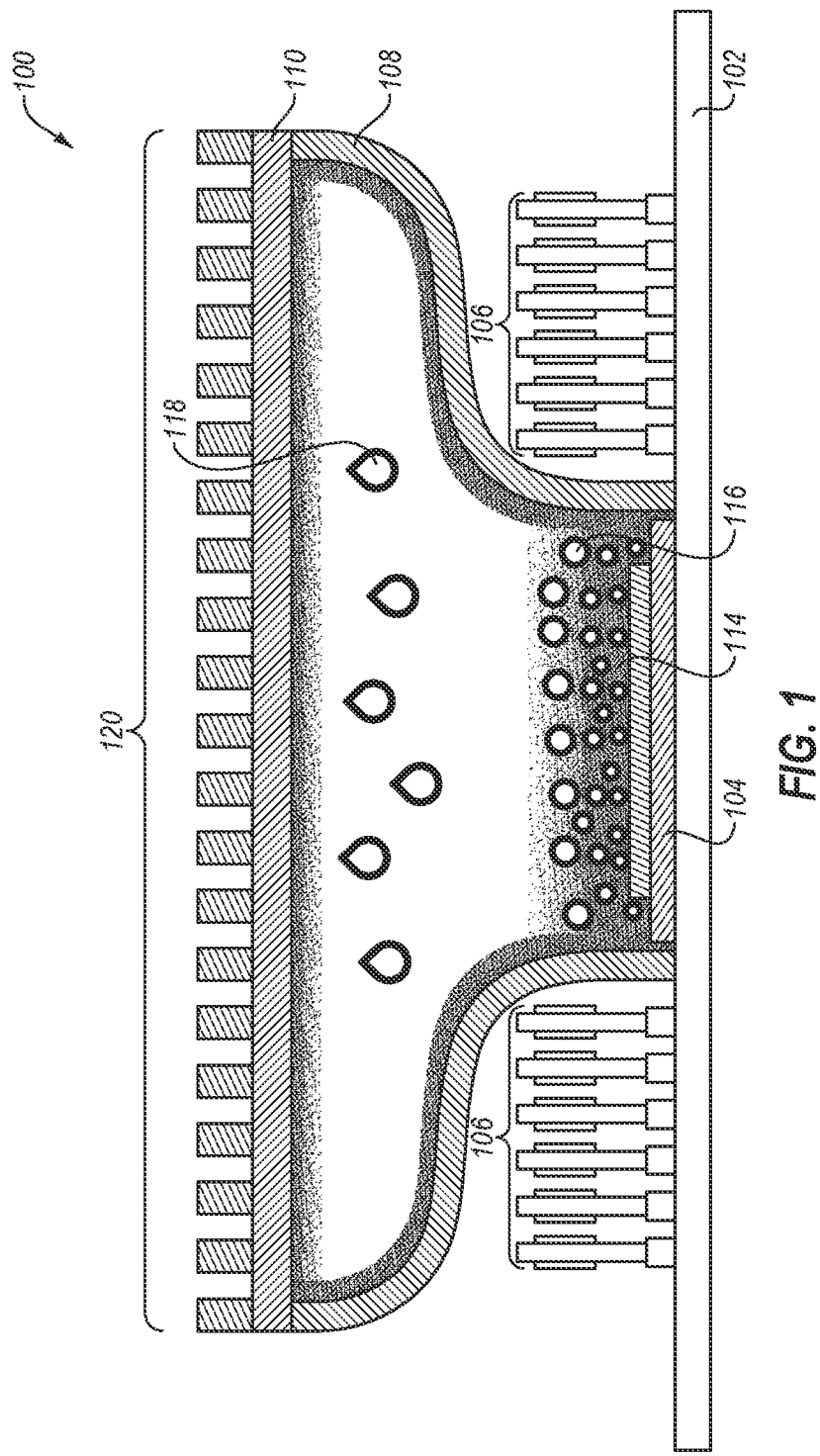
FIG. 1 illustrates an example of a motherboard assembly that includes a hybrid cooling system in accordance with the present disclosure.

Multiple types of two-phase immersion cooling systems are currently in development by various hardware vendors and cloud providers. Existing solutions rely on specialized cooling systems, enclosures, or immersion tanks for the servers, and/or rely on a supply of cooling water. Therefore, it would be extremely difficult for existing two-phase cooling systems to be deployed in current-generation datacenters.

The present disclosure is generally related to a new hybrid cooling system for computing devices, such as servers used in datacenters. A cooling system in accordance with the present disclosure is capable of supporting high-performance computing components (e.g., high-performance CPUs, GPUs) and can be deployed in standard air-cooled racks of existing datacenters.

A cooling system in accordance with the present disclosure can utilize a hermetically sealed coolant enclosure built around one or more heat-generating components on the motherboard of a computing device. Two-phase immersion cooling can then be performed with respect to the computing components that are located inside the enclosure. This allows for effective heat removal via the boiling of the dielectric working fluid. A cooling system in accordance with the present disclosure can also incorporate an air-cooled heat sink that has been designed to condense the coolant vapors.

A cooling system in accordance with the present disclosure can be a hybrid cooling system that utilizes both immersion cooling and air cooling. Computing components that are located inside the coolant enclosure can be cooled using two-phase immersion cooling. Other components on the motherboard can be cooled with air. The design of the coolant enclosure can be optimized for the reduced usage of dielectric working fluid and efficient air cooling of other motherboard components. The thermal design of the motherboard can be optimized for an efficient use of airflow for condensing of coolant vapors on the air-cooled heat sink and efficient cooling of other motherboard components.

In accordance with one embodiment of the present disclosure, a hybrid cooling system can be implemented as part of a motherboard assembly. A coolant container can be attached to a motherboard. An air-cooled heat sink can be attached to the coolant container to form a hermetically sealed chamber that is configured to retain a pool of dielectric working fluid. The coolant container can be positioned so that at least one heat-generating component (e.g., a CPU) on the motherboard is located in the hermetically sealed chamber and submerged in the pool of dielectric working fluid. The heat sink can be positioned to condense vapors formed from boiling of the dielectric working fluid and to cause condensed dielectric working fluid to return to the pool of dielectric working fluid. Other heat-generating components (e.g., memory devices) can be positioned on the motherboard outside of the hermetically sealed chamber. Thus, a cooling system in accordance with the present disclosure can be a hybrid cooling system that utilizes both immersion cooling techniques and air cooling techniques.

As noted above, current server designs implementing immersion cooling techniques are integrated with specialized water-cooling systems, specialized enclosures, or immersion tanks, and cannot be deployed in existing datacenters without lengthy and expensive refurbishment of datacenter engineering systems. In contrast to conventional immersion cooling systems, a cooling system in accordance with the present disclosure can be deployed in standard air-cooled racks of existing datacenters. No additional infrastructure is required for such datacenter deployments, allowing utilization of standardized datacenter deployment footprints. Therefore, servers can be deployed, operated, maintained, and repaired without major changes to datacenters' engineering systems or operational procedures. This allows for fast wide-scale deployment of next-generation servers with high-performance components (e.g., CPUs with high thermal design power (TDP)) without upgrades to existing datacenter infrastructure.

A cooling system in accordance with the present disclosure can also include a pressure monitoring and pressure release system for the hermetically sealed two-phase coolant container. This allows for safe operation of components (e.g., CPUs) inside the enclosure at the maximum capacity of the cooling system.

FIG. 1 illustrates an example of a motherboard assembly 100 that includes a hybrid cooling system in accordance with the present disclosure. The motherboard assembly 100 includes a motherboard 102. A plurality of computing components can be attached to the motherboard 102. In the embodiment shown in FIG. 1, the plurality of computing components include a CPU 104 and a plurality of memory devices 106. Of course, other kinds of computing components can also be included on the motherboard 102.

A coolant container 108 can be attached to the motherboard 102. In addition, a heat sink 110 can be attached to the coolant container 108. Together, the motherboard 102, the coolant container 108, and the heat sink 110 can form a hermetically sealed enclosure 112 over one or more of the computing components on the motherboard 102. The heat sink 110 can provide the ceiling for the enclosure 112, the coolant container 108 can provide the side walls for the enclosure 112, and the motherboard 102 can provide the floor for the enclosure 112.

In the depicted embodiment, the hermetically sealed enclosure 112 is formed over a single heat-generating component, namely the CPU 104. In an alternative embodiment, a hermetically sealed enclosure could be formed over a plurality of computing components. For example, a hermetically sealed enclosure could be formed over a plurality of CPUs, a CPU and a GPU, a CPU and a memory device, etc.

The hermetically sealed enclosure 112 formed by the motherboard 102, the coolant container 108, and the heat sink 110 can be configured to retain dielectric working fluid 114 that can be used for immersion cooling. The hermetically sealed enclosure 112 can be filled with a sufficient amount of dielectric working fluid 114 such that the CPU 104 is submerged in a pool of dielectric working fluid 114 at the bottom of the hermetically sealed enclosure 112. The CPU 104 generates heat during normal operation, which causes the dielectric working fluid 114 to boil. Vapors 116 formed from the boiling of the dielectric working fluid 114 rise to the upper portion of the hermetically sealed enclosure 112, where they come into contact with the heat sink 110 and condense. Condensed dielectric working fluid 118 then falls back down into the pool of dielectric working fluid 114 at the bottom of the hermetically sealed enclosure 112.

Some of the computing components on the motherboard 102 are positioned outside of the hermetically sealed enclosure 112. In particular, the plurality of memory devices 106 are positioned outside of the hermetically sealed enclosure 112. Thus, the cooling system shown in FIG. 1 is a hybrid cooling system that utilizes both immersion cooling techniques and air cooling techniques. In particular, immersion cooling techniques can be used for the CPU 104, and air cooling techniques can be used for the plurality of memory devices 106. The CPU 104 generates a greater amount of heat flux than the plurality of memory devices 106. Therefore, the immersion cooling techniques can be used for the computing component that generates a greater amount of heat flux (namely, the CPU 104) and the air cooling techniques can be used for the computing components that generate a lesser amount of heat flux (namely, the plurality of memory devices 106).

Advantageously, the heat sink 110 can simply be cooled by air. Therefore, the cooling system can be completely passive. Cooling can be achieved without the use of coolant or water circulation pumps, thereby improving the reliability of the system as well as potentially reducing the cost.

The heat sink 110 can comprise a plurality of fins 120. The fins 120 increase the surface area of the heat sink 110. The effectiveness of transferring heat from a metal surface to the air can depend at least in part on surface area. Therefore, by increasing the surface area of the heat sink 110, the fins 120 improve the ability of the heat sink 110 to transfer heat to the surrounding air. In the depicted embodiment, the fins 120 extend upward away from the body of the heat sink 110. However, there are many other possible configurations of fins that could be used on a heat sink in accordance with the present disclosure. In addition, there are other kinds of structures (e.g., spikes, ribs, dimples) that could be added to a heat sink to increase its surface area.

In the depicted embodiment, the fins 120 on the heat sink 110 are positioned outside of the hermetically sealed enclosure 112. In an alternative embodiment, the interior portion of the heat sink could be configured with structures (e.g., fins, spikes, ribs, dimples) that increase the surface area of the heat sink. Such structures could be used to increase the surface area that is available for vaporized working fluid to condense out on, and potentially provide points to help the condensed working fluid congregate and drip back to the pool of working fluid at the bottom of the enclosure. Those structures could also be used to help direct the condensed working fluid across the surface toward the center of the enclosure as opposed to dripping down on the side. For example, if the heat sink were configured with long ribs that were pointed toward the center of the enclosure, the condensed working fluid could run down to the ends of the points and then drip back down into the pool of working fluid below.

In some embodiments, the coolant container 108 and the heat sink 110 can be separate components. In other embodiments, the coolant container 108 and the heat sink 110 can be different parts of the same component.

Figure 2A:
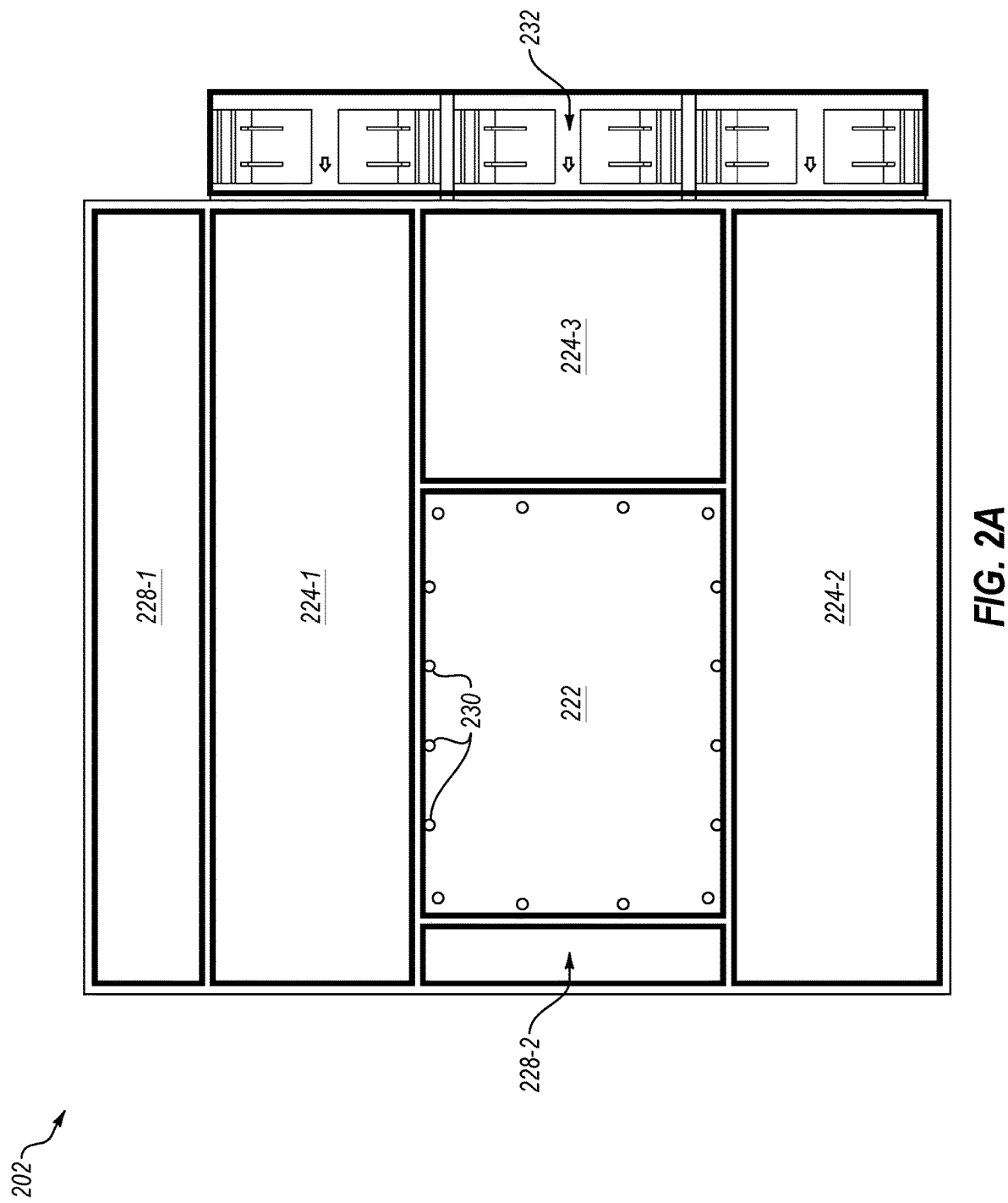
FIGS. 2A and 2B illustrate an example of a motherboard that has been partitioned into a plurality of thermal zones for use in a hybrid cooling system in accordance with the present disclosure.
Figure 2B:
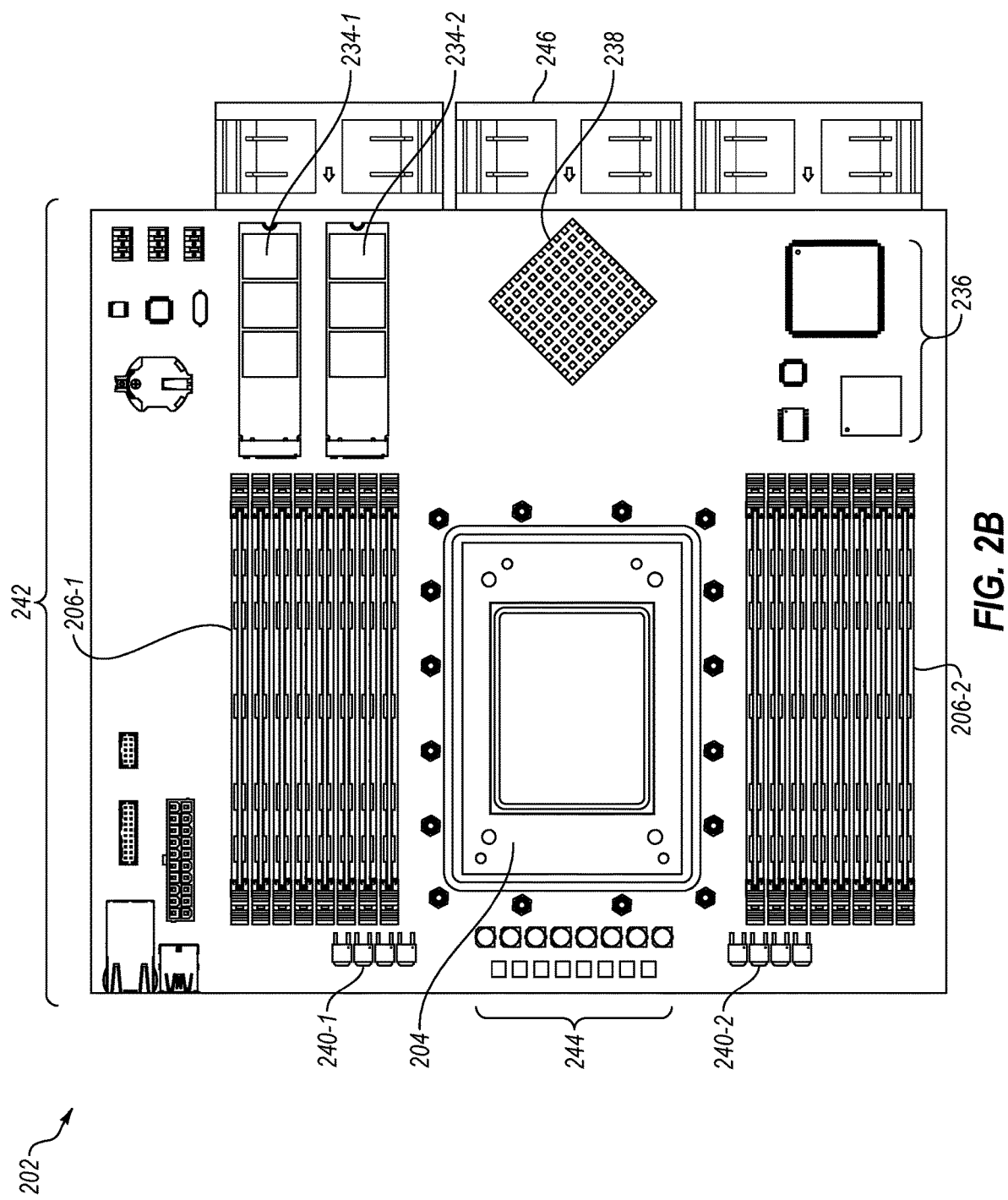

As noted above, one aspect of the present disclosure is related to a thermal design for a motherboard that enables an efficient use of airflow for condensing of coolant vapors on the air-cooled heat sink and efficient cooling of other motherboard components. FIGS. 2A and 2B illustrate an example of one possible design for a motherboard 202 in accordance with the present disclosure.

Reference is initially made to FIG. 2A. In the depicted embodiment, the motherboard 202 can be partitioned into a plurality of thermal zones. The plurality of thermal zones can include a two-phase cooling zone 222, a plurality of air-cooled zones (including a first air-cooled zone 224-1, a second air-cooled zone 224-2, and a third air-cooled zone 224-3), and a plurality of passively cooled zones (including a first passively cooled zone 228-1 and a second passively cooled zone 228-2).

The two-phase cooling zone 222 can be used for the computing component(s) that generate a large amount of heat flux and should be cooled using immersion cooling techniques. Examples of such computing components include CPUs and GPUs, although other types of computing components can be included in the two-phase cooling zone 222 as well. A coolant container 108 can be attached to the motherboard 202 in the two-phase cooling zone 222 so that a hermetically sealed enclosure 112 can be formed over those computing component(s). The two-phase cooling zone 222 can include a plurality of mounting holes 230, which can be used to attach the coolant container 108 to the motherboard 202.

Other zones on the motherboard 202 can be used for other kinds of computing components that do not generate as much heat flux as the component(s) that are placed in the two-phase cooling zone 222. For example, the first air-cooled zone 224-1 and the second air-cooled zone 224-2 can be used for memory devices (e.g., RAM modules), components with small heat sinks, and components without heat sinks. The third air-cooled zone 224-3 can be used for components with large heat sinks. The motherboard 202 can also include a zone 232 for fans to provide air circulation in the air cooled zones 224-1, 224-2, 224-3. This zone 232 may be referred to herein as an air circulation zone 232. The passively cooled zones 228-1, 228-2 can be used for computing components that do not require active air flow.

Reference is now made to FIG. 2B, which shows a plurality of computing components attached to the motherboard 202 in accordance with the thermal zones shown in FIG. 2A.

In the depicted example, a CPU 204 is attached to the motherboard 202 in the two-phase cooling zone 222. A first plurality of memory devices 206-1, a first plurality of data storage components 234-1, a second plurality of data storage components 234-2, and a first plurality of CPU voltage regulator (VR) metal-oxide-semiconductor field-effect transistors (MOSFETs) 240-1 are attached to the motherboard 202 in the first air-cooled zone 224-1. A second plurality of memory devices 206-2, a plurality of mid-TDP chips without heat sinks (which are collectively represented by the reference number 236), and a second plurality of CPU VR MOSFETs 240-2 are attached to the motherboard 202 in the second air-cooled zone 224-2. A high-TDP chip 238 with a large heat sink is attached to the motherboard 202 in the third air-cooled zone 224-3. A plurality of fans 246 are shown in the air circulation zone 232.

A plurality of input/output (I/O) components, connectors, and low TDP chips (which are collectively represented by the reference number 242) are attached to the motherboard 202 in the first passively cooled zone 228-1. A plurality of CPU VR capacitors and inductors 244 are attached to the motherboard 202 in the second passively cooled zone 228-2.

Advantageously, the design and layout of the motherboard 202 shown in FIGS. 2A and 2B allows the signal integrity, power distribution, and thermal design requirements of conventional server motherboards to be satisfied, while also permitting a hermetically sealed enclosure 112 to be formed that enables two-phase immersion cooling of some computing components on the motherboard 202.

Of course, the specific arrangement of computing components shown in FIGS. 2A and 2B is provided for purposes of example only and should not be interpreted as limiting the scope of the present disclosure. A motherboard can incorporate the principles of the hybrid cooling system disclosed herein while still utilizing a different layout of computing components.

Figure 3A:
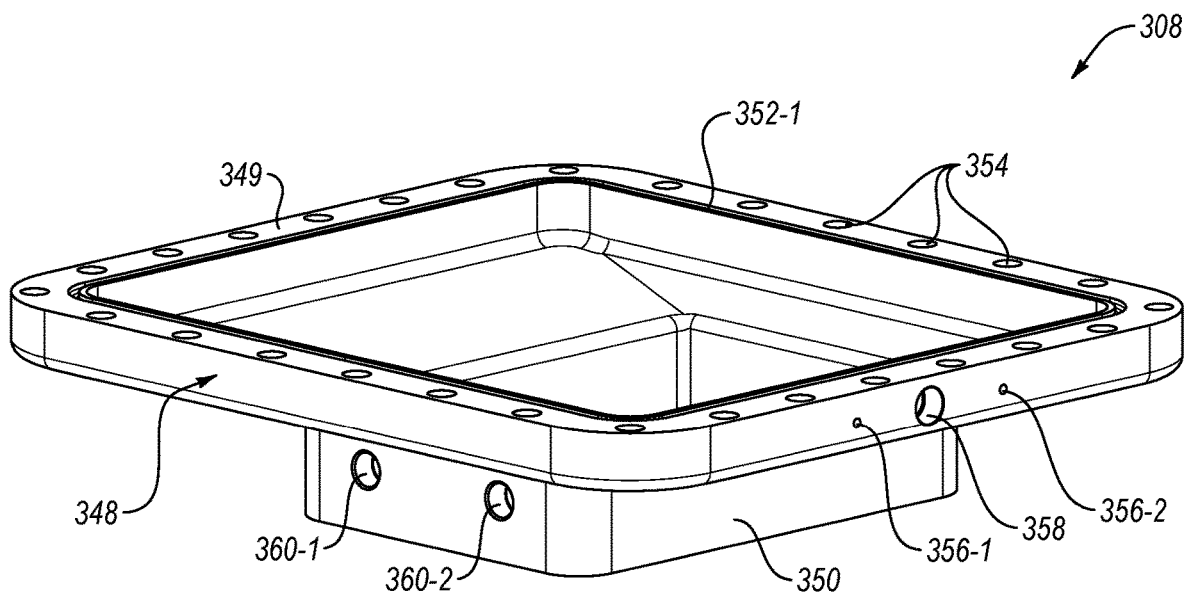
FIGS. 3A and 3B illustrate an example of a coolant container that can be used in a hybrid cooling system in accordance with the present disclosure.
Figure 3B:
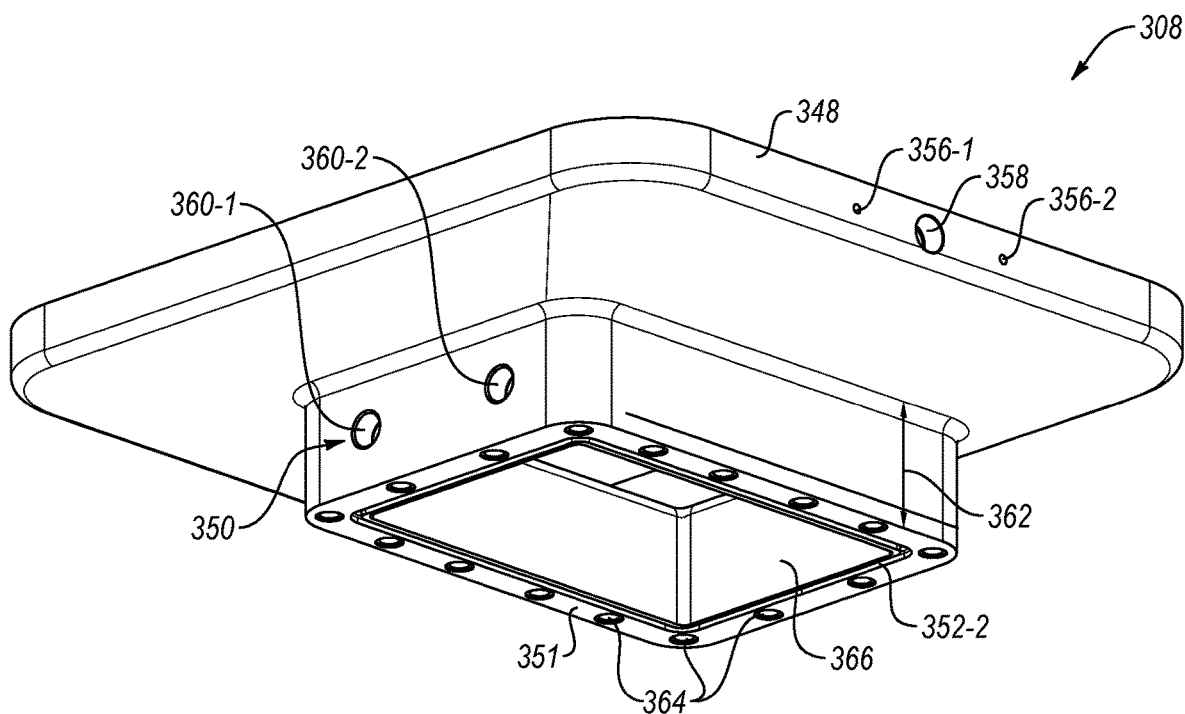

FIGS. 3A and 3B illustrate an example of a coolant container 308 that can be used in a hybrid cooling system in accordance with the present disclosure. The coolant container 308 is an example of the coolant container 108 that was described above in connection with FIG. 1. FIG. 3A is a top perspective view of the coolant container 308. FIG. 3B is a bottom perspective view of the coolant container 308.

Reference is initially made to FIG. 3A. The coolant container 308 can include an upper portion 348 and a lower portion 350. In the depicted embodiment, both the upper portion 348 and the lower portion 350 of the coolant container 308 have a rectangular shape. In an alternative embodiment, the upper portion and/or the lower portion of the coolant container can have a different shape.

The upper portion 348 of the coolant container 308 can include an opening. The size and shape of the opening can be suitable for accommodating a heat sink 110.

The upper portion 348 of the coolant container 308 can include an upper surface 349 that is configured for attachment to the heat sink 110. The upper surface 349 can include a groove 352-1. This groove 352-1 may be referred to herein as a top groove 352-1. The size and shape of the top groove 352-1 can be designed so that a gasket can fit within the top groove 352-1. A gasket that fits within the top groove 352-1 may be referred to herein as a top gasket.

The upper surface 349 on the upper portion 348 of the coolant container 308 can also include a plurality of holes 354 that can accommodate fasteners. The plurality of holes 354 can be, for example, threaded holes or blind holes with threaded inserts. The fasteners can attach the upper portion 348 of the coolant container 308 to the heat sink 110, and the top gasket can hermetically seal the upper portion 348 of the coolant container 308 to the heat sink 110.

The coolant container 308 can include a plurality of openings. In particular, the upper portion 348 of the coolant container 308 can include a first small opening 356-1, a second small opening 356-2, and a large opening 358 positioned between the first small opening 356-1 and the second small opening 356-2. Similarly, the lower portion 350 of the coolant container 308 can include a first large opening 360-1 and a second large opening 360-2. As will be discussed in greater detail below, the various openings in the coolant container 308 can be used to accommodate shut-off valves, pressure-release valves, and/or sensors. In some embodiments, these openings can take the form of threaded openings or press-fit openings.

Reference is now made to FIG. 3B. In some embodiments, the vertical height 362 of the lower portion 350 of the coolant container 308 can be substantially the same as the vertical height of one or more computing components that are located underneath the upper portion 348 of the coolant container 308 when the coolant container 308 is in place on the motherboard 102. For example, the vertical height 362 of the lower portion 350 of the coolant container 308 can be substantially the same as the vertical height of the memory devices 106 (e.g., RAM modules) on the motherboard 102 shown in FIG. 1.

The lower portion 350 of the coolant container 308 can also include an opening. The size and shape of the opening can be designed to fit around the component(s) that should be included in the hermetically sealed enclosure 112 that is configured to retain dielectric working fluid 114. For example, if the coolant container 308 were going to be used in connection with the motherboard 102 shown in FIG. 1, the size and shape of the opening can be designed to fit around the CPU 104. In embodiments where the hermetically sealed enclosure should include a plurality of components (e.g., a CPU and a GPU), the size and shape of the opening can be increased accordingly so that the plurality of components can be accommodated.

The lower portion 350 of the coolant container 308 can include a lower surface 351 that is configured for attachment to the motherboard 102. The lower surface 351 can include a groove 352-2. This groove 352-2 may be referred to herein as a bottom groove 352-2. The size and shape of the bottom groove 352-2 can be designed so that a gasket can fit within the groove 352-2. A gasket that fits within the bottom groove 352-2 may be referred to herein as a bottom gasket.

The lower surface 351 on the lower portion 350 of the coolant container 308 can also include a plurality of holes 364 that can accommodate fasteners. The plurality of holes 364 can be, for example, threaded holes or blind holes with threaded inserts. The fasteners can attach the lower portion 350 of the coolant container 308 to the motherboard 102. In some embodiments, the fasteners can attach the lower portion 350 of the coolant container 308 to a plate, and the motherboard 102 can be located between the lower portion 350 of the coolant container 308 and the plate. The lower portion 350 of the coolant container 308 can be adjacent to the top surface of the motherboard 102. The bottom gasket can fit within the bottom groove 352-2 and hermetically seal the lower portion 350 of the coolant container 308 to the top surface of the motherboard 102. The plate can be adjacent to the bottom surface of the motherboard 102. This type of configuration will be described in greater detail below.

In some embodiments, the interior part 366 of the lower portion 350 of the coolant container 308 can be made of a plastic material that is compatible with the dielectric working fluid 114.

The size and shape of the upper portion 348 of the coolant container 308 can be designed to maximize the surface area in which the heat sink 110 can come into contact with vaporized working fluid 114, thereby enabling condensation of the vaporized working fluid 114 to occur more easily and, as a result, increasing the effectiveness of the cooling process. The size and shape of the lower portion 350 of the coolant container 308 can be designed to accommodate the computing component(s) on the motherboard 102 that should be cooled via two-phase immersion cooling. In the embodiment shown in FIGS. 3A-B, the constraints just described cause the volume of the upper portion 348 of the coolant container 308 to be larger than the volume of the lower portion 350 of the coolant container 308. However, this may not always be necessary, and in some embodiments the volume of the lower portion of the coolant container could be equal to or even greater than the volume of the upper portion of the coolant container.

As noted above, in alternative embodiments, the upper portion and/or the lower portion of the coolant container can have a different shape. For example, in some alternative embodiments, a coolant container could have a round cross-section. One potential benefit of having a round cross-section would be ease of manufacturing. In some other alternative embodiments, a coolant container could be shaped as a triangle with one edge pointed towards the fans on the motherboard. One potential benefit of such a shape would be a reduction in the air flow resistance.

Figure 4A:
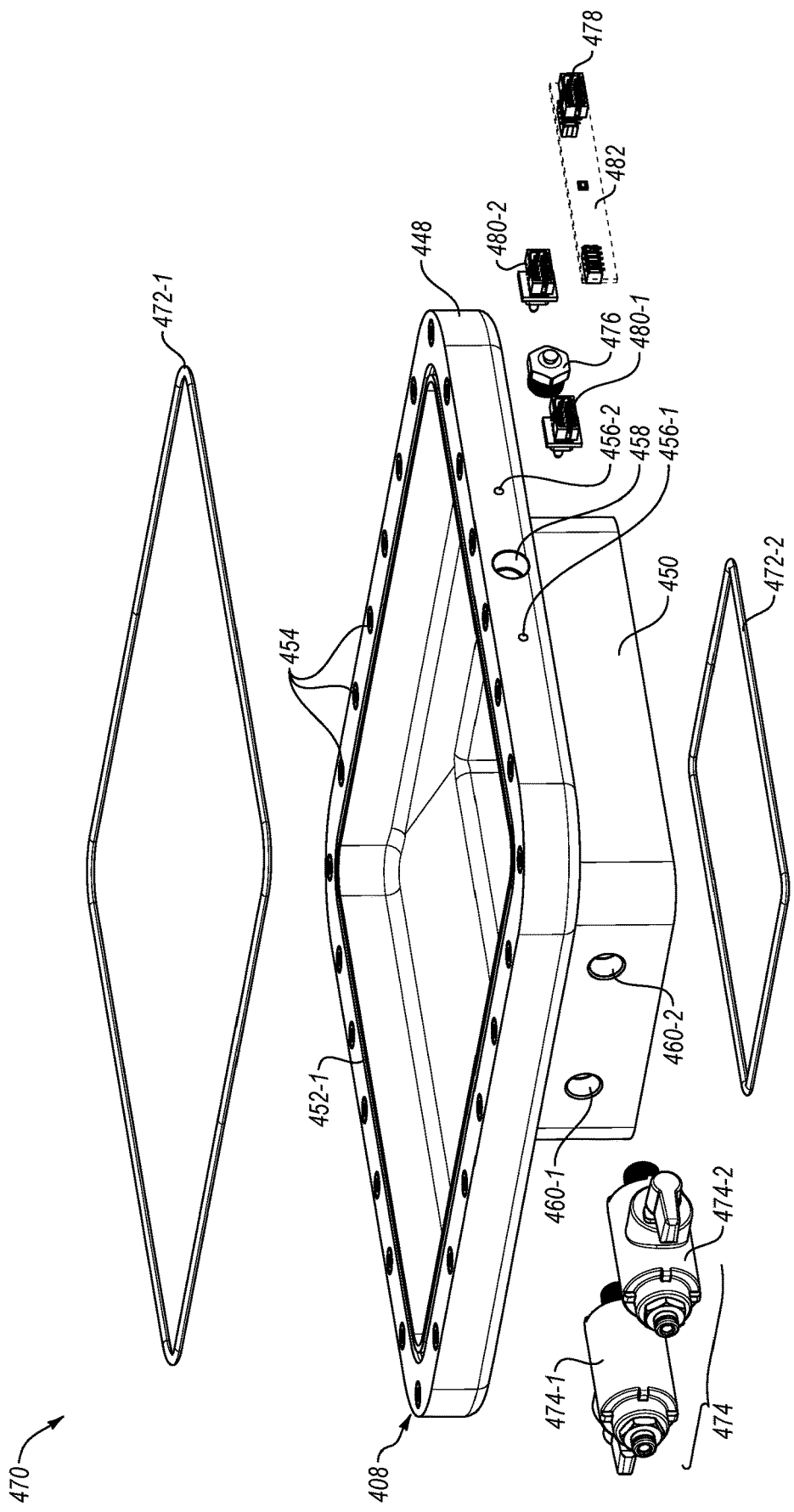
FIGS. 4A and 4B illustrate an example of a coolant container subassembly that can be used in a hybrid cooling system in accordance with the present disclosure.
Figure 4B:
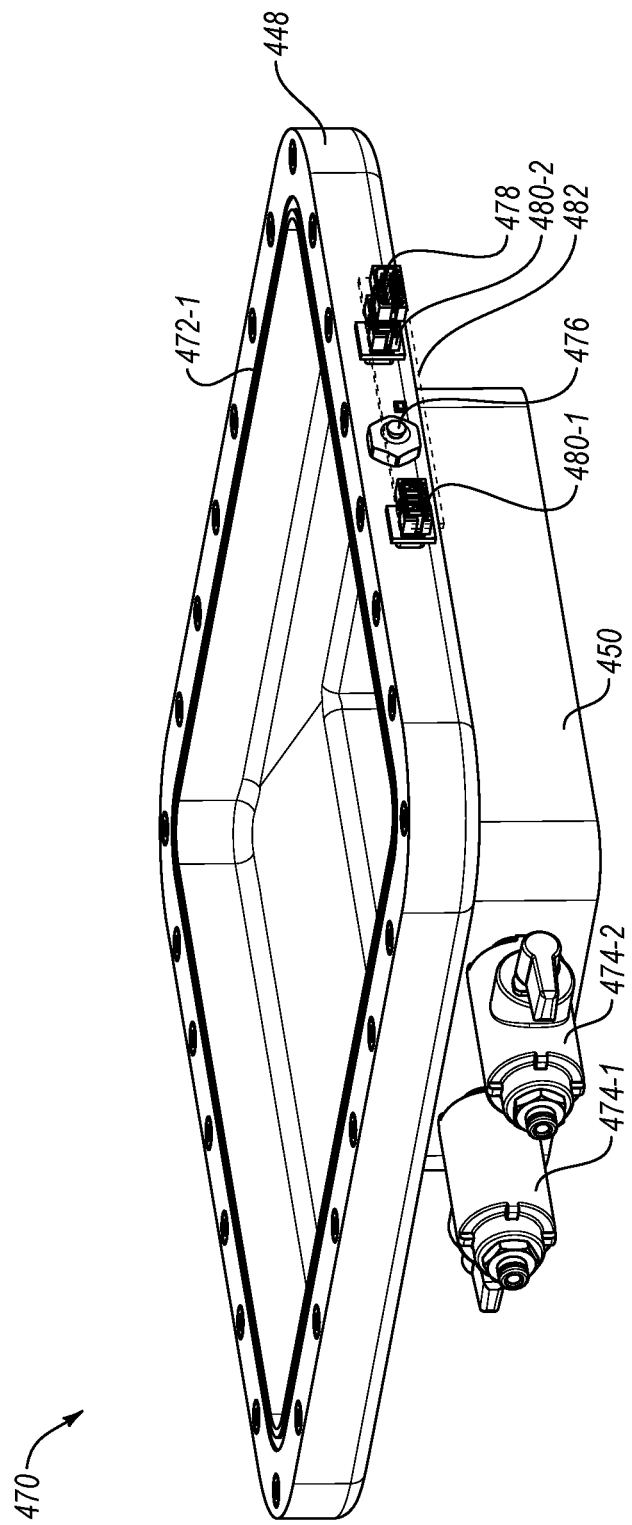

FIGS. 4A and 4B illustrate a coolant container subassembly 470 that includes a coolant container 408 along with other components that can be attached to or used with the coolant container 408. The coolant container 408 can be similar to the coolant container 308 that was described previously in connection with FIGS. 3A and 3B. FIG. 4A is an exploded view of the coolant container subassembly 470. FIG. 4B is a perspective view of the coolant container subassembly 470 shown in FIG. 4A with the various components in place.

The coolant container subassembly 470 can include a top gasket 472-1 that hermetically seals the upper portion 448 of the coolant container 408 to the heat sink 110. The coolant container subassembly 470 can also include a bottom gasket 472-2 that hermetically seals the lower portion 450 of the coolant container 408 to the top surface of the motherboard 102. The upper portion 448 of the coolant container 408 can also include a top groove 452-1 that is configured to receive the top gasket 472-1. The upper portion 448 of the coolant container 408 can also include a plurality of holes 454 that can accommodate fasteners for attaching the upper portion 448 of the coolant container 408 to the heat sink 110.

The coolant container subassembly 470 can also include a plurality of shut-off valves 474. A first shut-off valve 474-1 and a second shut-off valve 474-2 are shown in FIG. 4. The shut-off valves 474 can be used to fill the coolant container 408 with dielectric working fluid 114 and to remove dielectric working fluid 114 from the coolant container 408. The shut-off valves 474 can also be used to remove residual vapors 116 from the dielectric working fluid 114 before repair operations and/or maintenance operations are performed.

The shut-off valves 474 can be coupled to the lower portion 450 of the coolant container 408. For example, the shut-off valves 474 can be inserted into the openings in the lower portion 450 of the coolant container 408. In particular, the first shut-off valve 474-1 can be inserted into the first opening 460-1, and the second shut-off valve 474-2 can be inserted into the second opening 460-2. As noted above, the openings 460-1, 460-2 can be threaded holes or press-fit holes.

Each shut-off valve 474 can be configured to have an open position and a closed position. When a shut-off valve 474 is in an open position, dielectric working fluid 114 can flow into or out of the interior portion of the coolant container 408. When a shut-off valve 474 is in a closed position, dielectric working fluid 114 can be prevented from flowing into or out of the interior portion of the coolant container 408.

To fill the coolant container 408 with dielectric working fluid 114, a source of dielectric working fluid 114 can be connected to one or more shut-off valves 474 via some type of delivery mechanism, which can include a hose or a pipe. The shut-off valve(s) 474 can then be placed in the open position. Various techniques (e.g., a pressure difference, gravity) can be used to cause dielectric working fluid 114 to flow from the source of dielectric working fluid 114 into the coolant container 408.

A similar process can be followed to remove dielectric working fluid 114 from the coolant container 408. However, instead of connecting a source of dielectric working fluid 114 to the shut-off valve(s) 474, a receptacle for holding the dielectric working fluid 114 that is to be removed from the coolant container 408 can instead be connected to the shut-off valve(s) 474.

The coolant container subassembly 470 can also include a pressure relief valve 476. The pressure relief valve 476 can be a type of safety valve used to control or limit the pressure inside the hermetically sealed enclosure 112 that contains the dielectric working fluid 114. The pressure relief valve 476 can be configured to open at a predetermined amount of pressure within the hermetically sealed enclosure 112, thereby allowing some of the vapors 116 within the hermetically sealed enclosure 112 to escape in order to lower the pressure therein.

The pressure relief valve 476 can be coupled to the upper portion 448 of the coolant container 408. For example, the pressure relief valve 476 can be inserted into an opening 458 in the upper portion 448 of the coolant container 408. As noted above, the opening 458 can be a threaded opening or a press-fit opening.

The coolant container subassembly 470 can also include a plurality of sensors. In the depicted embodiment, the plurality of sensors include a temperature sensor 478 and a plurality of pressure sensors (specifically, a first pressure sensor 480-1 and a second pressure sensor 480-2). The coolant container subassembly 470 can also include a connector board 482 for connecting the temperature sensor 478 to the coolant container 408.

The temperature sensor 478 can be configured to detect the release of dielectric working fluid 114 (either in vaporized or liquid form) from the pressure relief valve 476. The temperature of the dielectric working fluid 114 inside the hermetically sealed enclosure 112 can be significantly different from (e.g., higher than) the ambient temperature outside of the hermetically sealed enclosure 112. Therefore, when dielectric working fluid 114 is released from the pressure relief valve 476, this can cause the temperature around the pressure relief valve 476 to change. The temperature sensor 478 can be configured to detect this change in temperature. In some embodiments, the temperature sensor 478 can be communicatively coupled to an external system, such as an administrator system that is responsible for monitoring the servers within a datacenter. When the release of dielectric working fluid 114 is detected, the external system can be notified so that appropriate remedial action can be taken.

The plurality of pressure sensors 480-1, 480-2 can be inserted into the small openings in the upper portion 448 of the coolant container 408. In particular, the first pressure sensor 480-1 can be inserted into the first small opening 456-1, and the second pressure sensor 480-2 can be inserted into the second small opening 456-2.

The plurality of pressure sensors 480-1, 480-2 can be configured to detect the pressure inside the hermetically sealed enclosure 112. In embodiments where one or more CPUs are located inside the hermetically sealed enclosure 112, the plurality of pressure sensors 480-1, 480-2 can allow various types of CPU power management to occur. For example, overclocking, frequency boosting, and/or throttling can be performed based on the pressure detected by the plurality of pressure sensors 480-1, 480-2.

In some embodiments, an auxiliary service processor (e.g., a baseboard management controller) can be attached to the motherboard 102, and the plurality of pressure sensors 480-1, 480-2 can be communicatively coupled to the auxiliary service processor. The auxiliary service processor can be configured to perform CPU power management based on signals received from the plurality of pressure sensors 480-1, 480-2. For example, in some embodiments the auxiliary service processor can be configured to cause a clock frequency of a CPU that is located inside the hermetically sealed enclosure 112 to be reduced in response to receiving an indication from at least one of the plurality of pressure sensors 480-1, 480-2 that the pressure in the hermetically sealed enclosure 112 exceeds a threshold value.

Reference is now made to FIG. 4B. The top gasket 472-1 has been placed in the top groove 452-1 in the upper portion 448 of the coolant container 408. Although not visible in FIG. 4B, the bottom gasket 472-2 has been placed in the bottom groove in the lower portion 450 of the coolant container 408. The shut-off valves 474-1, 474-2 have been inserted into the openings 460-1, 460-2 in the lower portion 450 of the coolant container 408. The pressure relief valve 476 has been inserted into the opening 458 in the upper portion 448 of the coolant container 408. The plurality of pressure sensors 480-1, 480-2 have been inserted into the small openings 456-1, 456-2 in the upper portion 448 of the coolant container 408. The temperature sensor 478 has been connected to the coolant container 408 via the connector board 482.

Figure 5A:
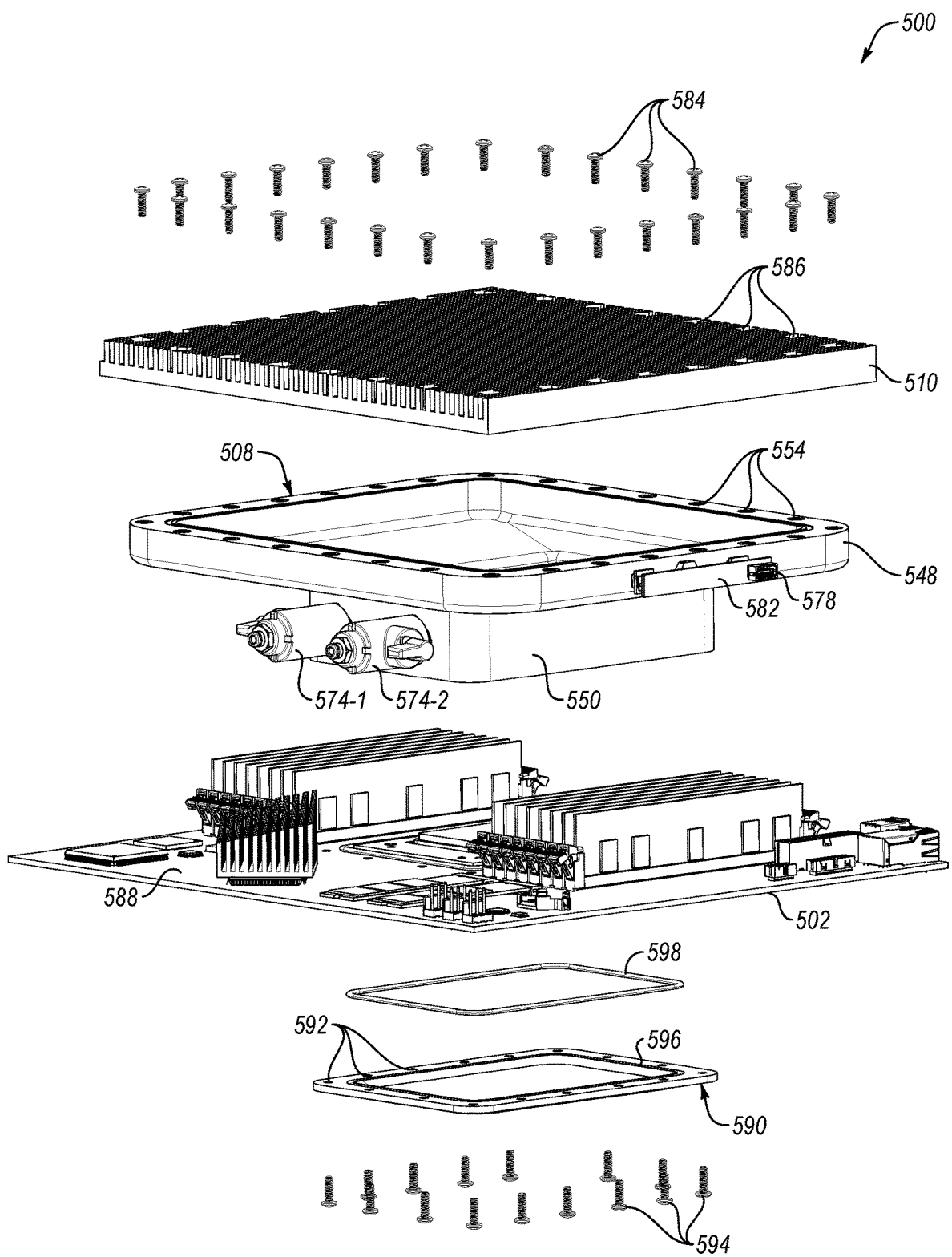
FIGS. 5A and 5B illustrate an example of a motherboard assembly in accordance with the present disclosure.
Figure 5B:
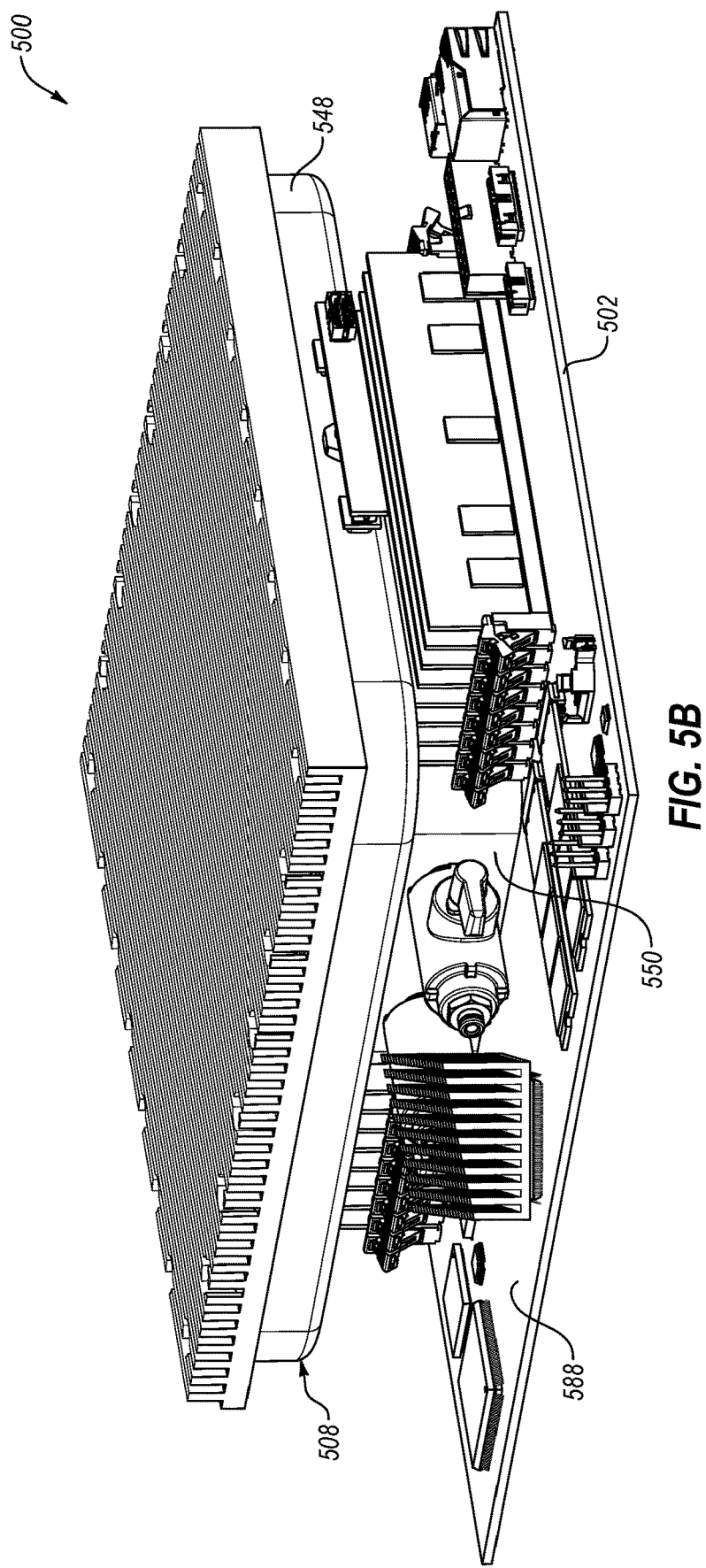

FIGS. 5A and 5B illustrate an example of a motherboard assembly 500 in accordance with the present disclosure. FIG. 5A is an exploded view of the motherboard assembly 500. FIG. 5B is a perspective view of the motherboard assembly 500 shown in FIG. 5A in its assembled state.

Reference is initially made to FIG. 5A. The motherboard assembly 500 includes a coolant container subassembly 570. The coolant container subassembly 570 can be similar to the coolant container subassembly 470 that was described previously in connection with FIGS. 4A and 4B. The coolant container subassembly 570 includes a coolant container 508 having an upper portion 548 and a lower portion 550. A first shut-off valve 574-1 and a second shut-off valve 574-2 are coupled to the lower portion 550 of the coolant container 508. A temperature sensor 578 is coupled to the upper portion 548 of the coolant container 508 via a connector board 582. One or more pressure sensors and a pressure relief valve can also be coupled to the coolant container 508, although these components are not visible in FIGS. 5A-B.

The motherboard assembly 500 also includes a heat sink 510. The heat sink 510 can be similar to the heat sink 110 that was described above in connection with the motherboard assembly 100 shown in FIG. 1. A plurality of fasteners 584 can be used to attach the heat sink 510 to the upper portion 548 of the coolant container 508. In the depicted embodiment, the fasteners 584 can be inserted through holes 586 in the heat sink and into corresponding holes 554 in the upper portion 548 of the coolant container 508.

The motherboard assembly 500 also includes a motherboard 502. The motherboard 502 includes a top surface 588 and a bottom surface. The bottom surface is not shown in FIGS. 5A-B, but it is opposite the top surface 588. A plurality of computing components are attached to the motherboard 502. A portion of the motherboard 502 can be reserved for components (e.g., CPUs) that generate significant amounts of heat flux and should be cooled using immersion cooling techniques. In the above discussion, this portion of the motherboard 502 was referred to as the two-phase cooling zone 222. The coolant container 508 can be attached to the motherboard 502 so that the two-phase cooling zone 222 is covered by the coolant container 508.

The motherboard assembly 500 also includes a plate 590. The plate 590 can enable the coolant container subassembly 570 to be attached to the motherboard 502. More specifically, the plate 590 can include a plurality of holes 592 around its perimeter. These holes 592 can be aligned with corresponding holes 530 in the motherboard 502 and corresponding holes in the lower portion 550 of the coolant container 508 (similar to the holes 364 shown in FIG. 3B). A plurality of fasteners 594 can be used to attach the plate 590 to the coolant container 508 through the motherboard 502. In particular, the lower portion 550 of the coolant container 508 can be attached to the top surface 588 of the motherboard 502, and the plate 590 can be attached to the lower portion 550 of the coolant container 508 through the bottom surface of the motherboard 502. When the motherboard assembly 500 is in its assembled state (as shown in FIG. 5B), the lower portion 550 of the coolant container 508 can be positioned adjacent to the top surface 588 of the motherboard 502, and the plate 590 can be positioned adjacent to the bottom surface of the motherboard 502.

The plate 590 can also include a groove 596. The size and shape of the plate 590 can be designed so that a gasket 598 can fit within the groove 596. When the plate 590 is attached to the coolant container 508, the gasket 598 can seal the plate 590 to the bottom surface of the motherboard 502.

In addition to enabling the coolant container subassembly 570 to be attached to the motherboard 502, the plate 590 can also perform the functioning of stiffening the motherboard 502. This can help support the motherboard 502 and reduce the likelihood of damage when the motherboard 502 is being handled (e.g., for repair and/or maintenance).

Reference is now made to FIG. 5B, which shows the motherboard assembly 500 in its assembled state. The coolant container 508 is shown with its upper portion 548 and its lower portion 550. The heat sink 510 is attached to the upper portion 548 of the coolant container 508. The lower portion 550 of the coolant container 508 is attached to the top surface 588 of the motherboard 502.

Figure 6:
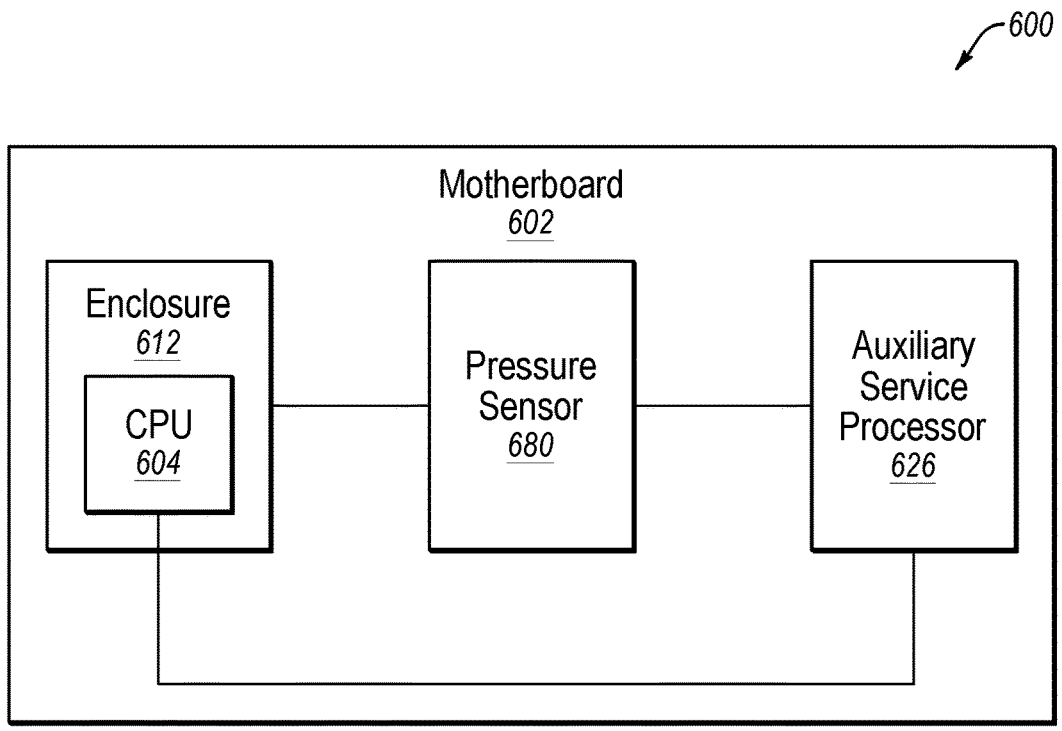
FIG. 6 illustrates components within a hybrid cooling system that can be used to implement CPU power management techniques.

As discussed above, a hybrid cooling system as disclosed herein can include one or more pressure sensors (e.g., the pressure sensors 480-1, 480-2 shown in FIGS. 4A-B) that can be configured to detect the pressure inside of the hermetically sealed enclosure. In embodiments where one or more CPUs are located inside the hermetically sealed enclosure, the plurality of pressure sensors can allow various types of CPU power management to occur. FIG. 6 illustrates components within a hybrid cooling system 600 that can be used to implement this feature.

FIG. 6 shows logical relationships among the various components. A CPU 604 can be located within a hermetically sealed enclosure 612. The hermetically sealed enclosure 612 can be similar to the hermetically sealed enclosure 112 that was described above in connection with FIG. 1. The pressure sensor 680 can be configured to detect the pressure inside the hermetically sealed enclosure 612. An auxiliary service processor 626 can be communicatively coupled to the pressure sensor 680 and also to the CPU 604. The auxiliary service processor 626 can be configured to perform one or more power management operations with respect to the CPU 604 based on signals received from the pressure sensor 680.

Figure 7:
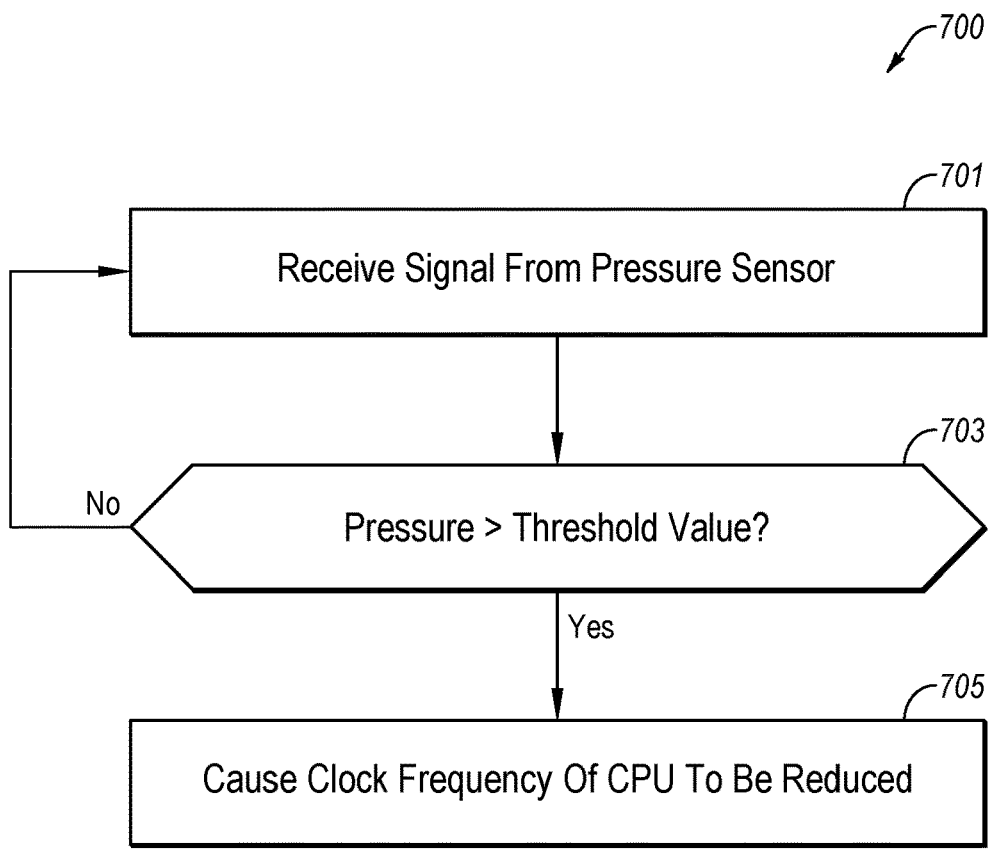
FIG. 7 illustrates an example of a method that can be performed by the auxiliary service processor in the system of FIG. 6.

FIG. 7 illustrates an example of a method 700 that can be performed by the auxiliary service processor 626 in the system 600 of FIG. 6. As indicated above, the auxiliary service processor 626 can be communicatively coupled to the pressure sensor 680. At 701, the auxiliary service processor 626 can receive signals from the pressure sensor 680. The signals can indicate the level of pressure inside the hermetically sealed enclosure 612. At 703, the auxiliary service processor 626 can determine, based on the signals received from the pressure sensor 680, whether the pressure inside the hermetically sealed enclosure 612 exceeds a pre-defined threshold value.

If the pressure inside the hermetically sealed enclosure 612 does not exceed the pre-defined threshold value, then the method 700 can return to 701 and proceed as described above. However, if the pressure inside the hermetically sealed enclosure 612 does exceed the pre-defined threshold value, then at 705 the auxiliary service processor 626 can cause the clock frequency of the CPU 604 to be reduced. This can involve sending one or more signals (e.g., commands) to the CPU 604.

In some embodiments, the method 700 shown in FIG. 7 enables overclocking to be performed with respect to the CPU 604. In general terms, overclocking is the practice of increasing the clock rate of a computing component to exceed that certified by the manufacturer. In other words, overclocking increases the operating speed of a given component. Normally, overclocking is used to increase the performance of a major chip or subsystem, such as the main processor (e.g., the CPU 604) or graphics controller.

Overclocking causes an increase in power consumption. When a particular component is overclocked, higher current and voltage are applied to the component so that its power consumption increases. Referring to the system 600 shown in FIG. 6, if overclocking is performed with respect to the CPU 604, this could cause the temperature (and therefore the pressure) within the hermetically sealed enclosure 612 to increase. If the temperature and pressure are increased too much, then the CPU 604 could be damaged. By using the pressure sensor 680 to monitor the pressure inside the hermetically sealed enclosure 612 and taking corrective action (e.g., reducing the clock frequency of the CPU 604) when the pressure exceeds a pre-defined threshold, overclocking can be performed in a safe way.

Figure 8:
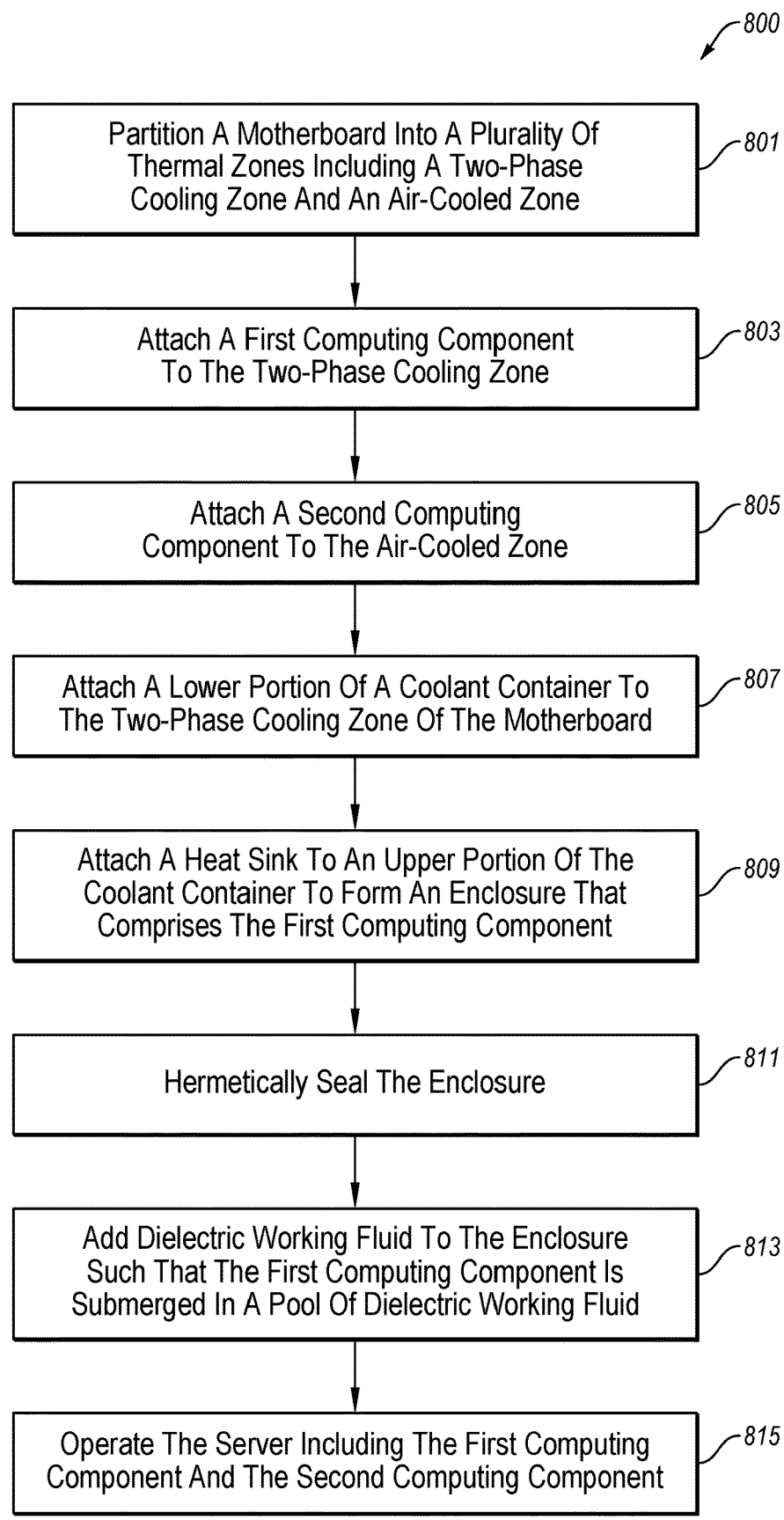
FIG. 8 illustrates an example of a method for cooling computing components in a server using a hybrid cooling system.

FIG. 8 illustrates an example of a method 800 for cooling computing components in a server using a hybrid cooling system. The method 800 will be described in relation to components described previously.

At 801, a motherboard 102 can be partitioned into a plurality of thermal zones, including a two-phase cooling zone 222 and one or more air-cooled zones 224-1, 224-2, 224-3. The motherboard 102 can include other thermal zones as well, such as one or more passively cooled zones 228-1, 228-2.

At 803, a first computing component (e.g., a CPU 104) can be attached to the two-phase cooling zone 222. At 805, a second computing component (e.g., a memory device 106) can be attached to an air-cooled zone 224-1.

At 807, a lower portion 350 of a coolant container 308 can be attached to the two-phase cooling zone 222 of the motherboard 102. At 809, a heat sink 110 can be attached to an upper portion 348 of the coolant container 308 to form an enclosure 112 that comprises the first computing component. At 811, the enclosure 112 can be hermetically sealed.

At 813, dielectric working fluid 114 can be added to the enclosure 112. A sufficient amount of dielectric working fluid 114 can be added so that the first computing component (e.g., the CPU 104) can be submerged in a pool of the dielectric working fluid 114.

At 815, the server (including the first computing component and the second computing component) can be operated. Operation of the server can cause the first computing component inside the hermetically sealed enclosure 112 to generate heat, which can cause the dielectric working fluid 114 to boil. The heat sink 110 can be positioned so that the heat sink 110 will condense vapors 116 formed from boiling of the dielectric working fluid 114 and cause condensed dielectric working fluid 118 to return to the pool of the dielectric working fluid 114.

The techniques disclosed herein provide many advantages relative to current approaches to computer cooling. Some of these advantages will be described below. Those skilled in the art may recognize additional advantages and benefits of the disclosed techniques beyond what is specifically described herein.

As discussed above, one aspect of the present disclosure is directed to a fully enclosed air-cooled design of a two-phase cooling enclosure. This provides several advantages relative to current approaches. For example, the compact cooling system design allows for high-density compute-deployments. Also, higher TDP CPUs can be used compared to traditional air-cooled systems. In addition, the self-enclosed cooling system design allows servers to be packaged as stand-alone deployable units. Further, servers can be deployed in standard air-cooled racks of existing datacenters. No additional infrastructure is required for datacenter deployments, allowing utilization of standardized datacenter deployment footprints. To the extent that new immersion cooling systems are incorporated into datacenters in the future, server fleets can be upgraded to the proposed new cooling systems incrementally without significant upfront costs for infrastructure upgrades.

The hermetic design of the two-phase cooling enclosure also provides several advantages relative to current approaches. For example, the hermetic design of the two-phase cooling enclosure enables a completely passive operation of the cooling system to be achieved without the use of coolant or water circulation pumps, thereby improving the reliability of the overall system. In addition, coolant losses can be eliminated during the normal operation of servers. Also, servers can be serviced independently without exposure of personnel and environment to coolant vapors or liquid. Further, the amount of two-phase coolant usage per server can be reduced significantly. Moreover, external server connections (I/O ports, power, etc.) are not exposed to liquid coolant.

The overall design of the cooling system can also provide several advantages relative to current approaches. For example, the cooling system can be built with off-the-shelf industrial components. Existing designs of server motherboards can be adapted with minimal changes. Existing designs of air-cooled servers can be used for packaging with minimal changes.

As an example, the term "dielectric working fluid" (or simply "working fluid") can refer to any nonconductive fluid in which computing devices can be submerged for the purpose of cooling the computing devices. Some examples of dielectric working fluids that can be used include synthetic fluids, fluorocarbon-based fluids, mineral oil, and deionized water. A dielectric working fluid may have a relatively low boiling point (e.g., 40-50° C.), such that heat generated by computing devices would normally cause the dielectric working fluid to boil.

As an example, the term "auxiliary service processor" can refer to a specialized microcontroller within a computing device, separate from the general purpose processor. An example of an auxiliary service processor is a baseboard management controller (BMC). It can be useful for auxiliary service processors to be included in servers that are part of a cloud computing system because they allow system administrators to perform various tasks remotely. For example, a system administrator can use a management system (e.g., a fabric controller) to remotely communicate with an auxiliary service processor to take corrective actions, such as resetting or power cycling a server.

As an example, two structures can be in "fluid communication" with one another if there is a path for a fluid to flow between the two structures. In this context, the term "fluid" can refer generally to any substance that has the tendency to assume the shape of its container, and may include a liquid or a gas.

As an example, the term "heat flux" can refer to the rate of thermal energy flow per unit surface area of a heat transfer surface.

As an example, the term "thermal design power," or "TDP," can indicate the maximum amount of heat generated by a computing component that a cooling system is designed to dissipate under any workload. In some contexts, the TDP can refer to the maximum amount of heat generated by the component that the cooling system can dissipate under real-world conditions.

As an example, the term "communicatively coupled" can refer to coupling of components such that the components are able to communicate with one another through, for example, wired, wireless, or other communications media. The term "communicatively coupled" can include direct, communicative coupling as well as indirect or "mediated" communicative coupling. For example, a component A can be communicatively coupled to a component B directly by at least one communication pathway, or a component A can be communicatively coupled to a component B indirectly by at least a first communication pathway that directly couples component A to a component C and at least a second communication pathway that directly couples component C to component B. In this case, component C is said to mediate the communicative coupling between component A and component B.

The term "determining" (and grammatical variants thereof) can encompass a wide variety of actions. For example, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there can be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The phrase "based on" does not mean "based only on," unless expressly specified otherwise. In other words, the phrase "based on" describes both "based only on" and "based at least on."

The steps, operations, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A coolant container subassembly for a hybrid cooling system, the coolant container subassembly comprising:
   a coolant container comprising an upper portion and a lower portion, an upper cross-sectional area of the coolant container having a greater surface area than a lower cross-sectional area of the coolant container;
   a lower surface on the lower portion of the coolant container, the lower surface being configured for attachment to a motherboard to form a hermetically sealed enclosure that encompasses a first computing component on the motherboard without encompassing a second computing component on the motherboard, the hermetically sealed enclosure being configured to retain dielectric working fluid in fluid communication with the first computing component;
   an air-cooled heat sink; and
   an upper surface on the upper portion of the coolant container, the upper surface being configured for attachment to the air-cooled heat sink such that the air-cooled heat sink is positioned to condense vapors formed from boiling of the dielectric working fluid and to cause condensed dielectric working fluid to return to a pool of the dielectric working fluid that comprises the first computing component.

2. The coolant container subassembly of claim 1, wherein the first computing component generates a greater amount of heat flux than the second computing component.

3. The coolant container subassembly of claim 1, wherein:
   the first computing component comprises a central processing unit (CPU); and
   the second computing component comprises a memory device.

4. The coolant container subassembly of claim 1, wherein:
   the motherboard comprises a two-phase cooling zone and an air-cooled zone that is separate from the two-phase cooling zone;
   the first computing component and the coolant container are attached to the two-phase cooling zone of the motherboard; and the second computing component is attached to the air-cooled zone of the motherboard.

5. The coolant container subassembly of claim 1, further comprising:
a first groove in the upper portion of the coolant container;
a first gasket that fits within the first groove and that seals the upper portion of the coolant container to the heat sink;
a second groove in the lower portion of the coolant container; and
a second gasket that fits within the second groove and that seals the lower portion of the coolant container to the motherboard.

6. The coolant container subassembly of claim 1, further comprising a shut-off valve comprising an open position and a closed position, wherein the shut-off valve is coupled to the coolant container such that:
the dielectric working fluid can flow into or out of an interior portion of the coolant container when the shut-off valve is in the open position; and
the dielectric working fluid is prevented from flowing into or out of the interior portion of the coolant container when the shut-off valve is in the closed position.

7. The coolant container subassembly of claim 1, further comprising a pressure relief valve coupled to the coolant container.

8. The coolant container subassembly of claim 7, further comprising a temperature sensor that is positioned to detect a change in temperature that results from a release of the dielectric working fluid from the pressure relief valve.

9. The coolant container subassembly of claim 1, wherein:
the coolant container subassembly further comprises a pressure sensor that is coupled to the coolant container and positioned to detect pressure in the hermetically sealed enclosure; and
the pressure sensor is configured to be communicatively coupled to an auxiliary service processor on the motherboard.

10. The coolant container subassembly of claim 9, wherein:
the first computing component is a central processing unit (CPU); and
the auxiliary service processor is configured to cause a clock frequency of the CPU to be reduced in response to receiving an indication from the pressure sensor that the pressure in the hermetically sealed enclosure exceeds a threshold value.

11. The coolant container subassembly of claim 1, further comprising a plate that is configured for attachment to the lower portion of the coolant container through a bottom surface of the motherboard.

12. The coolant container subassembly of claim 1, wherein:
the motherboard comprises a plurality of mounting holes; and
the coolant container subassembly further comprises a plurality of fasteners that attach the coolant container to the motherboard via the plurality of mounting holes.

13. A motherboard assembly comprising a hybrid cooling system, the motherboard assembly comprising:
a motherboard comprising a two-phase cooling zone and an air-cooled zone;
a coolant container comprising an upper portion and a lower portion, an upper cross-sectional area of the coolant container having a greater surface area than a lower cross-sectional area of the coolant container;
a lower surface on the lower portion of the coolant container, the lower surface being configured for attachment to the two-phase cooling zone of the motherboard to form a hermetically sealed enclosure that encompasses a first computing component in the two-phase cooling zone, the hermetically sealed enclosure being configured to retain enough dielectric working fluid to submerge the first computing component in the dielectric working fluid;
an air-cooled heat sink;
an upper surface on the upper portion of the coolant container, the upper surface being configured for attachment to the air-cooled heat sink such that the air-cooled heat sink is positioned to condense vapors formed from boiling of the dielectric working fluid and to cause condensed dielectric working fluid to return to a pool of the dielectric working fluid that comprises the first computing component; and
a shut-off valve coupled to the coolant container, the shut-off valve being in fluid communication with an interior portion of the coolant container.

14. The motherboard assembly of claim 13, wherein:
the motherboard further comprises a passively cooled zone; and
the two-phase cooling zone is positioned between the passively cooled zone and the air-cooled zone.

15. The motherboard assembly of claim 13, wherein at least one additional computing component is attached to the two-phase cooling zone of the motherboard and positioned within the hermetically sealed enclosure when the lower surface on the lower portion of the coolant container is attached to the two-phase cooling zone of the motherboard.

16. The motherboard assembly of claim 13, wherein the shut-off valve comprises an open position and a closed position, and wherein the shut-off valve is coupled to the coolant container such that:
the dielectric working fluid can flow into or out of an interior portion of the coolant container when the shut-off valve is in the open position; and
the dielectric working fluid is prevented from flowing into or out of the interior portion of the coolant container when the shut-off valve is in the closed position.

17. The motherboard assembly of claim 13, further comprising:
a pressure relief valve coupled to the coolant container; and
a temperature sensor that is positioned to detect a change in temperature that results from a release of the dielectric working fluid from the pressure relief valve.

18. The motherboard assembly of claim 13, wherein:
the motherboard assembly further comprises a pressure sensor that is coupled to the coolant container and positioned to detect pressure in the hermetically sealed enclosure; and
the pressure sensor is configured to be communicatively coupled to an auxiliary service processor on the motherboard.

19. A method for cooling computing components in a server using a hybrid cooling system, the method comprising:
partitioning a motherboard into a plurality of thermal zones including a two-phase cooling zone and an air-cooled zone;
attaching a first computing component to the two-phase cooling zone;
attaching a second computing component to the air-cooled zone;

attaching a lower portion of a coolant container to the two-phase cooling zone of the motherboard;

attaching a heat sink to an upper portion of the coolant container to form an enclosure that comprises the first computing component;

hermetically sealing the enclosure;

adding dielectric working fluid to the enclosure to form a pool of the dielectric working fluid, wherein the first computing component is submerged in the pool of the dielectric working fluid; and operating the server including the first computing component and the second computing component, wherein operating the server includes operating the server without the use of a pump for the dielectric working fluid.

20. The method of claim 19, wherein operation of the first computing component causes the dielectric working fluid to boil and further comprising positioning the heat sink to condense vapors formed from boiling of the dielectric working fluid and to cause condensed dielectric working fluid to return to the pool of the dielectric working fluid.

21. The coolant container subassembly of claim 1, wherein the upper portion extends over a portion of the motherboard.

\* \* \* \* \*